(12) United States Patent
Ashida et al.

(10) Patent No.: US 8,791,500 B2
(45) Date of Patent: Jul. 29, 2014

(54) SEMICONDUCTOR DEVICE HAVING LATERAL INSULATED GATE BIPOLAR TRANSISTOR

(71) Applicant: Denso Corporation, Kariya (JP)

(72) Inventors: Youichi Ashida, Nukata-gun (JP); Shigeki Takahashi, Okazaki (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 13/719,389

(22) Filed: Dec. 19, 2012

(65) Prior Publication Data

US 2013/0168730 A1    Jul. 4, 2013

(30) Foreign Application Priority Data

Dec. 28, 2011 (JP) ................................. 2011-288244
Sep. 18, 2012 (JP) ................................. 2012-204594

(51) Int. Cl.
*H01L 29/74* (2006.01)
*H01L 31/111* (2006.01)

(52) U.S. Cl.
USPC ........... 257/141; 257/139; 257/144; 257/557; 257/575; 438/316; 438/325; 438/355

(58) Field of Classification Search
USPC .......... 257/139, 141, 144, 557, 575, E29.201; 438/316, 325
See application file for complete search history.

(56) References Cited

U.S. PATENT DOCUMENTS

| | | | |
|---|---|---|---|
| 5,329,142 A | 7/1994 | Kitagawa et al. | |
| 5,448,083 A | 9/1995 | Kitagawa et al. | |
| 5,796,125 A | 8/1998 | Matsudai et al. | |
| 5,828,101 A | 10/1998 | Endo | |
| 6,198,130 B1 | 3/2001 | Nobuto et al. | |
| 7,880,227 B2 * | 2/2011 | Takahashi | ...................... 257/330 |
| 7,977,704 B2 * | 7/2011 | Koyama et al. | ............... 257/139 |

FOREIGN PATENT DOCUMENTS

JP    10-223883 A    8/1998

OTHER PUBLICATIONS

Manabu Takei, et al., "DB (Dielectric Barrier) IGBT with Extreme Injection Enhancement," Proceeding of the 22nd International Symposium on Power Semiconductor Devices & ICs, Hiroshima, Jun. 2010, pp. 383-386 (discussed on page 2 of the speficification).
Office Action mailed Jan. 7, 2014 issued in corresponding JP patent application No. 2012-204594 (and English translation).

* cited by examiner

*Primary Examiner* — Theresa T Doan
(74) *Attorney, Agent, or Firm* — Posz Law Group, PLC

(57) ABSTRACT

A semiconductor device having a lateral insulated gate bipolar transistor includes a first conductivity type drift layer, a second conductivity type collector region formed in a surface portion of the drift layer, a second conductivity type channel layer formed in the surface portion of the drift layer, a first conductivity type emitter region formed in a surface portion of the channel layer, and a hole stopper region formed in the drift layer and located between the collector region and the emitter region. Holes are injected from the collector region into the drift layer and flow toward the emitter region through a hole path. The hole stopper region blocks a flow of the holes and narrows the hole path to concentrate the holes.

16 Claims, 15 Drawing Sheets

US 8,791,500 B2

SEMICONDUCTOR DEVICE HAVING LATERAL INSULATED GATE BIPOLAR TRANSISTOR

CROSS REFERENCE TO RELATED APPLICATION

This application is based on Japanese Patent Application No. 2011-288244 filed on Dec. 28, 2011 and No. 2012-204594 filed on Sep. 18, 2012, the contents of which are incorporated herein by reference.

FIELD

The present disclosure relates generally to semiconductor devices having an insulated gate bipolar transistor (IGBT), and relates in particular to a semiconductor device having a lateral IGBT formed by using a silicon-on-insulator (SOI) substrate.

BACKGROUND

When an IGBT is turned ON, an electric current flows based on a hole current and an electron current. The hole current flows based on holes injected from a collector. The electron current flows based on electrons injected from an emitter. To achieve a low ON-voltage, there is a need to increase the amount of holes and electrons. The low ON-voltage can be achieved by increasing the amount of holes injected form the collector. However, when the amount of the injected holes is large, a tail current occurs due to the holes during switching so that fast switching cannot be achieved. Therefore, to achieve a low ON-voltage and a fast switching, it is very important to increase the amount of the electron current when the IGBT is turned ON. In an IGBT, the amount of injected electrons depends on the density of holes near an emitter. Therefore, to achieve a low ON-voltage and a fast switching, it is important to increase the density of holes near the emitter without excessively increasing the amount of holes injected from the collector.

However, in an IGBT, the density of holes decreases with the distance to the emitter due to diffusion and recombination. As a result, the amount of injected electrons decreases.

The present inventors consider that the above disadvantage can be overcome by forming a thin n-type layer, called the carrier storage (CS) layer, in an emitter layer. Further, a non-patent document 1 (M. Takei et al. Proc. ISPSD'10, pp. 383-386, June 2010) discloses that an oxide layer is formed in a drift layer of a vertical IGBT to narrow a hole path so that conductivity modulation can be increased.

However, the CS layer may degrade a breakdown voltage and increase a manufacturing cost. Further, the non-patent document 1 discloses a structure for increasing the conductivity modulation in a vertical IGBT only. In other words, the non-patent document 1 is silent on a lateral IGBT.

SUMMARY

In view of the above, it is an object of the present disclosure to provide a semiconductor device having a lateral IGBT for achieving a low ON-voltage and a fast switching.

According to an aspect of the present disclosure, a semiconductor device having a lateral insulated gate bipolar transistor includes a semiconductor substrate having a first conductivity type drift layer. A second conductivity type collector region is formed in a surface portion of the drift layer. A second conductivity type channel layer is formed in the surface portion of the drift layer and has a straight-shaped portion on each side of the collector region. A first conductivity type emitter region is formed in a surface portion of the channel layer and terminated inside the channel layer. The emitter region has a straight-shaped portion extending parallel to a longitudinal direction of the collector region. A gate insulation layer is in contact with a channel region of the channel layer. The channel region is located between the emitter region and the drift layer. A gate electrode is formed on a surface of the gate insulation layer. A collector electrode is electrically connected to the collector region. An emitter electrode is electrically connected to the emitter region and the channel layer. A hole stopper region is formed in the drift layer and located between the collector region and the emitter region. Holes are injected from the collector region into the drift layer and flow toward the emitter region through a hole path. The hole stopper region blocks a flow of the holes and narrows the hole path to concentrate the holes.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

First Embodiment

Figure 1:
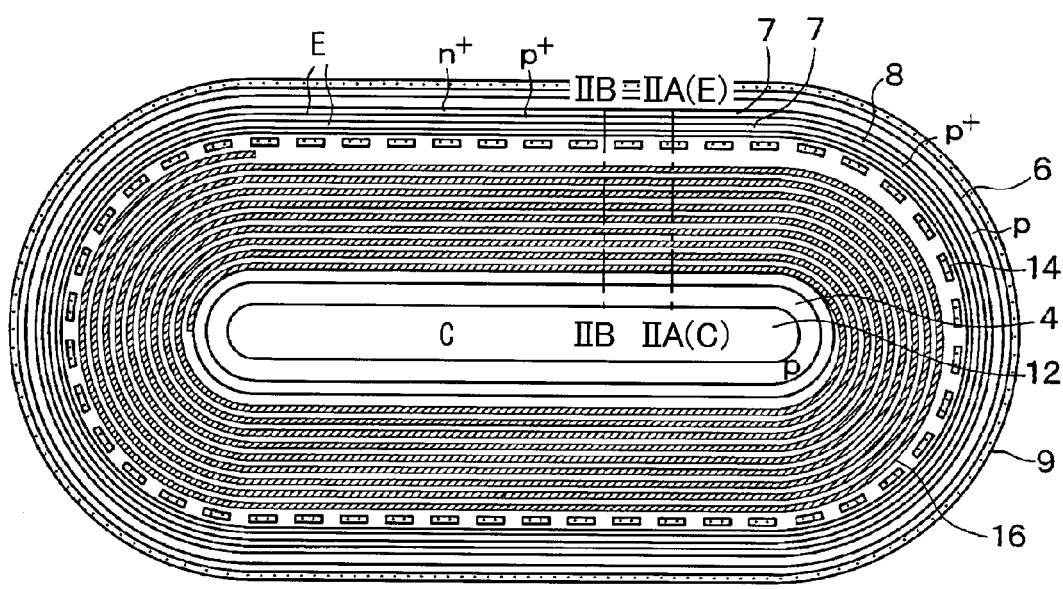
FIG. 1 is a diagram illustrating a top layout view of a semiconductor device according to a first embodiment of the present disclosure.
Figure 2A:
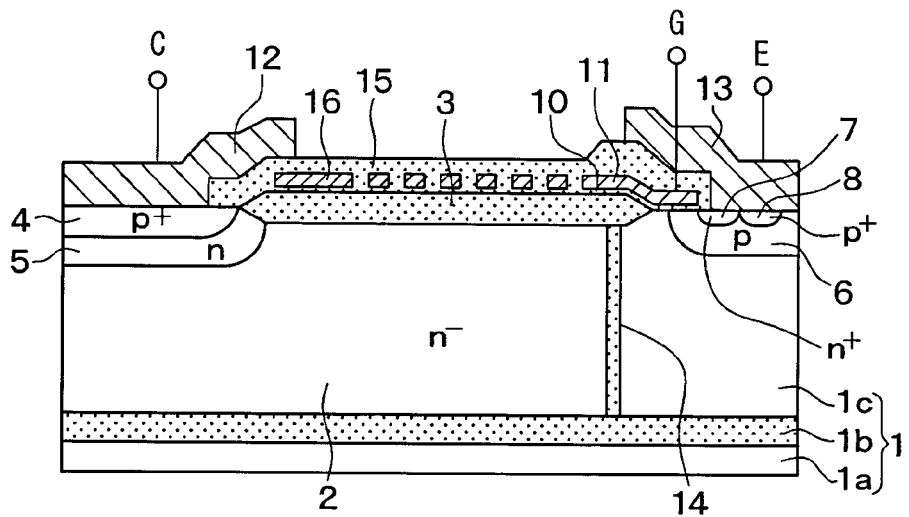
FIG. 2A is a diagram illustrating a cross-sectional view taken along line IIA-IIA in FIG. 1.
Figure 2B:
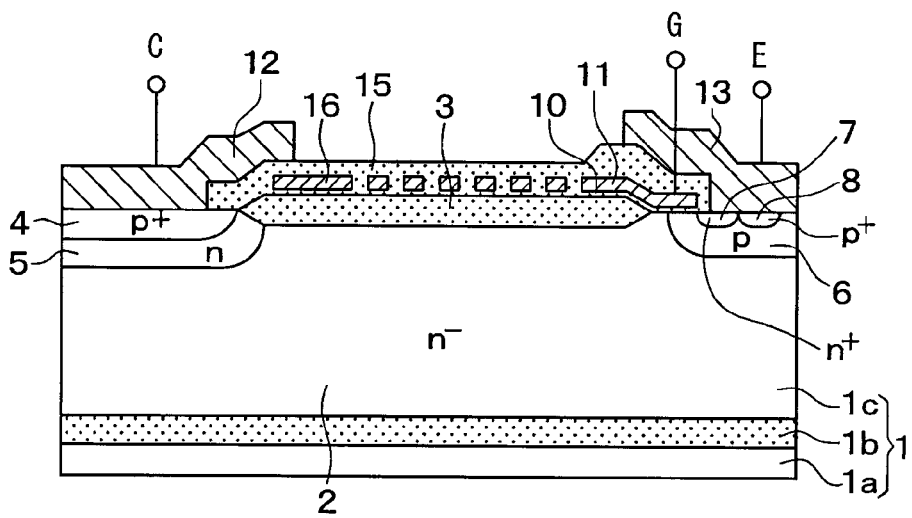
FIG. 2B is a diagram illustrating a cross-sectional view taken along line IIB-IIB in FIG. 1.

A semiconductor device according to a first embodiment of the present disclosure is described below. The semiconductor device has a lateral insulated gate bipolar transistor (IGBT) with a planar gate structure. FIG. 1 is a diagram illustrating a top layout view of the semiconductor device. FIG. 2A is a diagram illustrating a cross-sectional view taken along the line IIA-IIA in FIG. 1. FIG. 2B is a diagram illustrating a cross-sectional view taken along the line IIB-IIB in FIG. 1.

As shown in FIGS. 2A and 2B, according to the first embodiment, the lateral IGBT is formed by using a SOI substrate 1. The SOI substrate 1 includes a supporting substrate 1a, a buried oxide layer (BOX) 1b on the supporting substrate 1a, and an active layer is on the BOX layer 1b. The supporting substrate 1a and the active layer 1c are made of silicon. The BOX layer 1b serves as an electrical insulation layer. The active layer 1c serves as a n$^-$-type drift layer 2. Components of the lateral IGBT are formed in a surface portion of the drift layer 2.

The thickness of the BOX layer 1b is not limited to a specific value. The thickness and the impurity concentration of the active layer 1c (i.e., drift layer 2) are not limited to specific values. The thickness of the BOX layer 1b and the thickness and the impurity concentration of the active layer 1c are set so that the lateral IGBT can have a predetermined breakdown voltage. For example, the thickness of the BOX later 1b can be 4 μm or more. To obtain a stable breakdown voltage of 600 volts or more, it is preferable to set the values as follows: The thickness of the BOX layer 1b is 5 μm or more. The n-type impurity concentration of the active layer 1c ranges from $1 \times 10^{14}$ cm$^{-3}$ to $1.2 \times 10^{15}$ cm$^{-3}$, if the thickness of the active layer 1c is 15 μm or less. The n-type impurity concentration of the active layer is ranges from $1 \times 10^{14}$ cm$^{-3}$ to $8 \times 10^{14}$ cm$^{-3}$, if the thickness of the active layer 1c is 20 μm.

A LOCOS layer 3 is formed on a surface of the drift layer 2 to isolate the components of the lateral IGBT from each other. A p$^+$-type collector region 4 is formed in the surface portion of the drift layer 2 and exposed outside the LOCOS layer 3. The collector region 4 has a longitudinal direction parallel to the surface of the drift layer 2. The collector region 4 is surrounded by a n-type buffer layer 5. The buffer layer 5 has an impurity concentration greater than that of the drift layer 2.

Further, a p-channel well layer 6, a n$^+$-type emitter region 7, and a p$^+$-type contact layer 8 are formed in the surface portion of the drift layer 2 around the collector region 4 and exposed outside the LOCOS layer 3.

A surface portion of the well layer 6 serves a channel region. For example, the thickness of the well layer 6 can be 2 μm or less, and the width of the well layer 6 can be 6 μm or less. As shown in FIG. 1, the well layer 6 is arranged concentrically with respect to the collector region 4 so that the collector region 4 can be entirely surrounded by the well layer 6. That is, the well layer 6 has an ellipse shape, when viewed from the top, to surround the collector region 4. Specifically, the well layer 6 has a pair of straight-shaped portions and a pair of arc-shaped portions. The straight-shaped portions extend in the longitudinal direction of the collector region 4. One arch-shaped portion connects one end of one straight-shaped portion to one end of the other straight-shaped portion, and the other arch-shaped portion connects the other end of one straight-shaped portion to the other end of the other straight-shaped portion.

The well layer 6 has a body layer which is located below and around the contact layer 8. A p-type impurity concentration of the body layer is so high that the body layer can reduce a voltage drop which is caused by a Hall current flowing from a collector to an emitter through the surface. The body layer reduces or prevents operation of a parasitic npn transistor which is constructed with the emitter region 7, the well layer 6, and the drift layer 2. Thus, a turn-off time of the lateral IGBT can be improved.

The emitter region 7 is formed in a surface portion of the well layer 6 and terminated inside the well layer 6. Like the well layer 6, the emitter region 7 has an ellipse shape, when viewed from the top, to surround the collector region 4. Specifically, the emitter region 7 has a pair of straight-shaped portions and a pair of arch-shaped portions. The straight-shaped portions of the emitter region 7 extend in the longitudinal direction of the collector region 4. One arch-shaped portion connects one end of one straight-shaped portion to one end of the other straight-shaped portion, and the other arch-shaped portion connects the other end of one straight-shaped portion to the other end of the other straight-shaped portion.

The contact layer 8 is used to clamp the well layer 6 to an emitter potential. The contact layer 8 has an impurity concentration greater than that of the well layer 6. As shown in FIG. 1, the contact layer 8 is arranged concentrically with respect to the collector region 4 so that the collector region 4 can be entirely surrounded by the contact layer 8. That is, the contact layer 8 has an ellipse shape, when viewed from the top, to surround the collector region 4.

Specifically, the contact layer 8 has a pair of straight-shaped portions and a pair of arch-shaped portions. The straight-shaped portions of the contact layer 8 extend in the longitudinal direction of the collector region 4. One arch-shaped portion connects one end of one straight-shaped portion to one end of the other straight-shaped portion, and the other arch-shaped portion connects the other end of one straight-shaped portion to the other end of the other straight-shaped portion.

As shown in FIG. 1, the well layer 6, the emitter region 7, and the contact layer 8 of the lateral IGBT is surrounded by a trench isolation structure 9. The trench isolation structure 9 has a trench filled with polysilicon and an electrically insulating film. Thus, the lateral IGBTs are electrically isolated from each other by the trench isolation structure 9. According to the first embodiment, one lateral IGBT is surrounded by each trench isolation structure 9. Alternatively, two or more lateral IGBTs can be surrounded by each trench isolation structure 9.

A gate insulating layer 10 is formed on the surface of the SOI substrate 1 and in contact with the surface of the well layer 6. A gate electrode 11 is located on the well layer 6 through the gate insulating layer 10. For example, the gate electrode 11 can be made of doped polysilicon. The surface portion of the well layer 6 becomes the channel region, when a predetermined gate voltage is applied to the gate electrode 11.

A collector electrode 12 is formed on a surface of the collector region 4 and electrically connected to the collector region 4. Further, an emitter electrode 13 is formed on surfaces of the emitter region 7 and the contact layer 8 and electrically connected to the emitter region 7 and the contact layer 8. As shown in FIG. 1, the collector is surrounded by the well layer 6, the emitter region 7, and the contact layer 8. Accordingly, the collector electrode 12 is surrounded by the emitter electrode 13.

As shown in FIG. 2A, the lateral IGBT has a hole stopper region 14. The hole stopper region 14 is located in the drift layer 2 between the collector and the emitter. Specifically, the hole stopper region 14 is located between the collector region 4 and the emitter region 7.

When holes injected from the collector region 4 moves from the collector to the emitter, the hole stopper region 14 blocks the flow of the holes to narrow a hole path through which the holes move toward the emitter region 7. Thus, the hole stopper region 14 concentrates the holes in the hole path shown in FIG. 2B. In this way, the hole stopper region 14 increases the hole density in the hole path, where the hole stopper region 14 is not formed. The hole stopper region 14 extends in a thickness direction of the SOI substrate 1. According to the first embodiment, the hole stopper region 14 extends from the surface of the drift layer 2 to the BOX layer 1b. That is, the hole stopper region 14 penetrates the drift layer 2.

For example, the hole stopper region 14 can have the same structure as the trench isolation structure 9, which has a trench filled with polysilicon and electrically insulating film. In such an approach, the trench isolation structure 9 and the hole stopper region 14 can be simultaneously formed in the same manufacturing process. According to the first embodiment, as shown in FIG. 1, the collector region 4 is surrounded by the hole stopper region 14. The hole stopper region 14 has an ellipse shape, when viewed from the top, to surround the collector region 4. Specifically, the hole stopper region 14 has a pair of straight-shaped portions and a pair of arc-shaped portions. The straight-shaped portions of the hole stopper region 14 extend in the longitudinal direction of the collector region 4. The arc-shaped portions of the hole stopper region 14 surround ends of the collector region 4 in the longitudinal direction of the collector region 4. It is noted that each of the straight-shaped portion and the arc-shaped portion of the hole stopper region 14 is divided into multiple parts. That is, the hole stopper region 14 is entirely divided into multiple parts. The hole path is defined between adjacent divided parts of the hole stopper region 14. Therefore, not only a region where a current flows but also a region where a current does not flow is formed between the collector and the emitter. As a result, the area serving as a channel is reduced.

A separation distance between adjacent divided parts of the hole stopper region 14 is not limited to a specific value, and a length of each divided part of the hole stopper region 14 is not limited to a specific value. To achieve an uniform current density in the longitudinal direction of the collector region 4, it is preferable that adjacent divided parts of the hole stopper region 14 are equally separated from each other. According to the first embodiment, the hole stopper region 14 is located as near as possible to the emitter for reasons described later.

An interlayer dielectric film 15 is formed on the LOCOS layer 3. A scroll-shaped field plate (SRFP) 16 is formed in the interlayer dielectric film 15 between the collector and the gate. The SRFP 16 is a resistor layer of doped polysilicon. The SRFP 16 serves to maintain a uniform potential gradient between the collector and the gate. Specifically, as shown in FIG. 1, the SRFP 16 is wound in a scroll (i.e., spiral) shape around the collector electrode 12. A first end portion of the SRFP 16 is electrically connected to the collector electrode 12, and a second end portion of the SRFP 16 is electrically connected to the gate electrode 11. The potential of the SRFP 16 gradually decreases with the distance from the collector electrode 12 due to a voltage drop caused by an internal resistance of the SRFP 16. That is, the potential of the SRFP 16 gradually decreases in a direction from the first end portion of the SRFP 16 to the second end portion of the SRFP 16. In other words, the potential of the SRFP 16 gradually decreases in a direction from the collector electrode 12 to the emitter electrode 13. Thus, the potential gradient in the SRFP 16 can be maintained uniform. Accordingly, the potential gradient in the drift layer 2, which is located below the SRFP 16 across the LOCOS layer 3 and the interlayer dielectric film 15, can be maintained uniform. Thus, electric field concentration resulting from non-uniform potential gradient is reduced so that the breakdown voltage can be improved. Further, impact ionization is reduced so that an increase in turn-off switching time can be reduced. The second electrode of the SRFP 16 can be electrically connected to the emitter electrode 13 instead of the gate electrode 11.

Next, an operation of the lateral IGBT is described. When the gate voltage is applied to the gate electrode 11, the channel region appears in the surface portion of the well layer 6, which is located below the gate electrode 11 between the emitter region 7 and the drift layer 2. Then, electrons are injected from the emitter electrode 13 and the emitter region 7 into the drift layer 2 through the channel region. Accordingly, holes are injected from the collector electrode 12 and the collector region 4 into the drift layer 2. Thus, conductivity modulation occurs in the drift layer 2 so that a large current can flow between the emitter and the collector.

Figure 3:
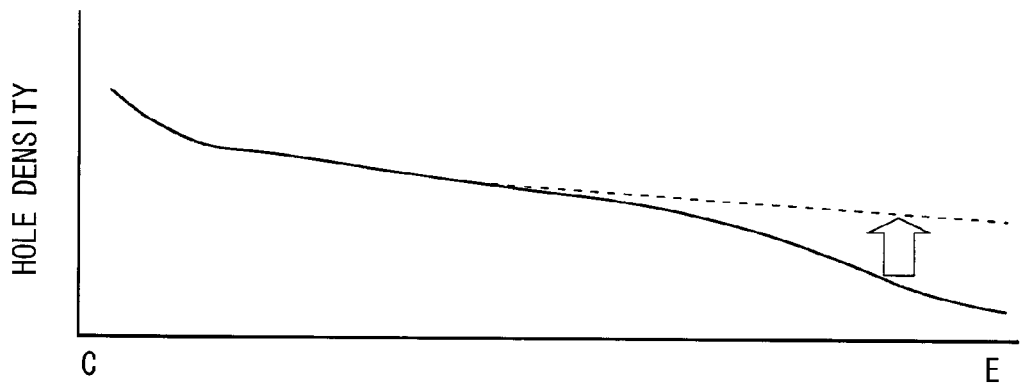
FIG. 3 is a diagram illustrating a hole density distribution in the semiconductor device along the line IIA-IIA in FIG. 1.

As described above, according to the first embodiment, the hole stopper region 14 is formed in the drift layer 2 between the collector region 4 and the emitter region 7. The hole stopper region 14 blocks the flow of the holes so that the hole path can be narrowed. Thus, the holes are concentrated in the hole path between adjacent divided parts of the hole stopper region 14 so that the hole density can be increased in the hole path. FIG. 3 shows a hole density distribution in the cross section taken along the line IIA-IIA in FIG. 1. In FIG. 3, a solid line represents the hole density distribution when the hole stopper region 14 is not formed, and a broken line represents the hole density distribution when the hole stopper region 14 is formed. That is, the broken line in FIG. 3 represents the hole density distribution in the lateral IGBT according to the first embodiment. As indicated by the solid line in FIG. 3, when the hole stopper region 14 is not formed, the hole density drops significantly near the emitter (denoted as "E" in FIG. 3). In contrast, as indicated by the broken line in FIG. 3, when the hole stopper region 14 is formed, the drop of the hole density near the emitter can be much reduced. It is noted that the amount of injected electrons depends on the hole density near the emitter. Therefore, as the hole density becomes higher near the emitter, the amount of injected electrons becomes higher. Thus, the amount of the current flowing through the hole path is increased.

An ON-voltage of the lateral IGBT depends on an internal resistance between the emitter and the collector and also depends on the amount of the current flowing between the emitter and the collector. In particular, as the amount of the current flowing between the emitter and the collector is larger, the ON-voltage becomes smaller. According to the first embodiment, the hole path is narrowed so that the amount of the current in the hole path can be increased. Thus, the ON-voltage of the lateral IGBT can be reduced, and switching speed of the lateral IGBT can be increased.

Here, it is assumed that the hole stopper region 14 is located far away from the emitter. In this case, the hole path, which is narrowed by the hole stopper region 14 at a position far away from the emitter, spreads near the emitter. That is, although the holes are concentrated by the hole stopper region 14, the concentrated holes are diffused before reaching the emitter. As a result, the hole density drops near the emitter. To prevent this disadvantage, according to the first embodiment, as shown in FIG. 2A, the hole stopper region 14 is located as near as possible to the emitter As described above, according to the first embodiment, the hole stopper region 14 for blocking the flows of the holes is formed in the drift layer 2 between the emitter and the collector. In such an approach, the hole path is narrowed by the hole stopper region 14 so that the holes can be concentrated in the hole path Thus, the hole density is increased in the hole path so that the amount of injected electrons can be increased in the hole path. Thus, both the reduction in the ON-voltage and the increase in the switching speed of the lateral IGBT can be achieved.

(Modification of the First Embodiment)

Figure 4:
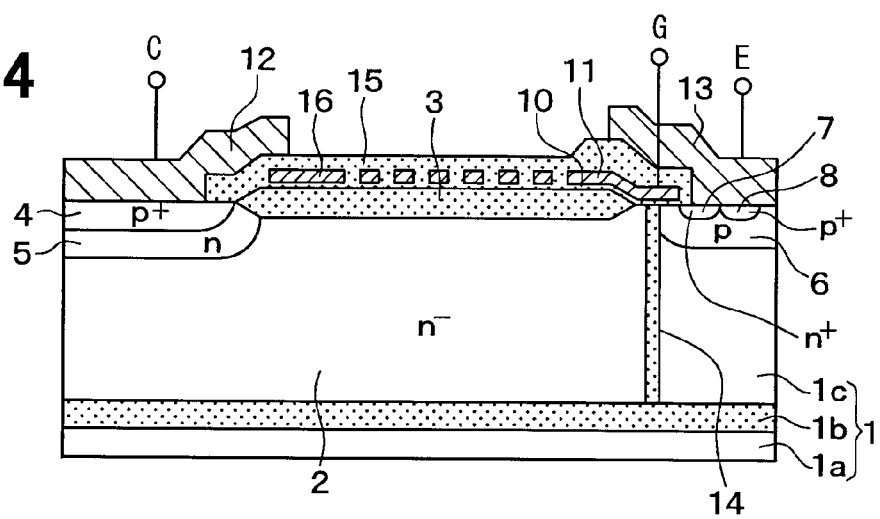
FIG. 4 is a diagram, corresponding to FIG. 2A, and illustrating a cross-sectional view of a semiconductor device according to a first modification of the first embodiment.
Figure 5:
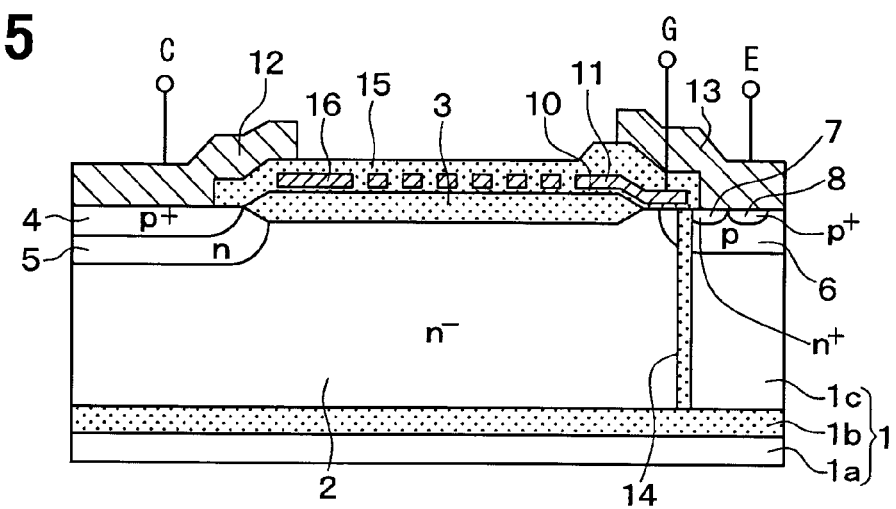
FIG. 5 is a diagram, corresponding to FIG. 2A, and illustrating a cross-sectional view of a semiconductor device according to a second modification of the first embodiment.

As shown in FIG. 2A, according to the first embodiment, the hole stopper region 14 is not in contact with the well layer 6. Alternatively, as shown in FIGS. 4 and 5, the hole stopper region 14 can be in contact with the well layer 6. In FIG. 4, the hole stopper region 14 is in contact with an end of the well layer 6. In FIG. 5, the hole stopper region 14 is located inside the well layer 6 and in contact with the emitter region 7. In such an approach, the amount of injected electrons are much increased so that the reduction in the ON-voltage and the increase in the switching speed of the lateral IGBT can be surely achieved.

Figure 6A:
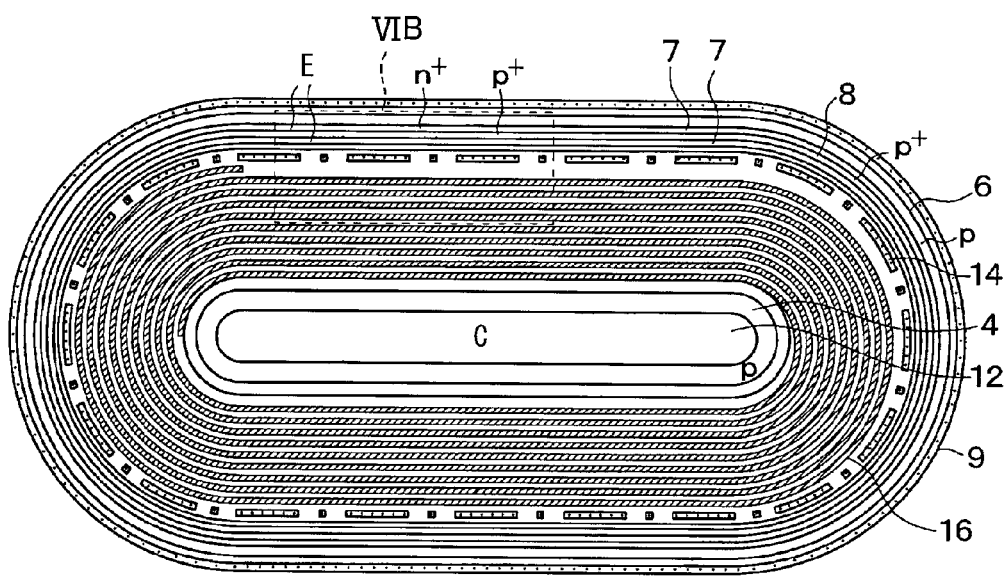
FIG. 6A is a diagram, corresponding to FIG. 2A, and illustrating a cross-sectional view of a semiconductor device according to a third modification of the first embodiment.
Figure 6B:
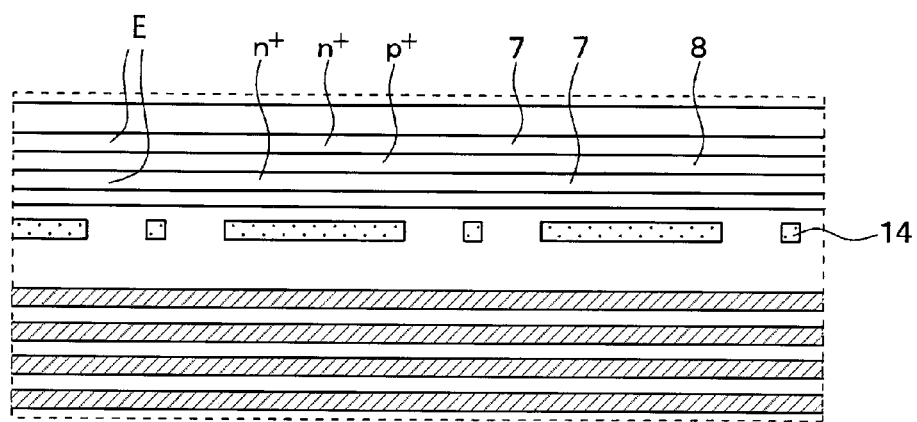
FIG. 6B is a diagram and illustrating an enlarged view of an area VIB in FIG. 6A.

As shown in FIG. 1, according to the first embodiment, the divided parts of the hole stopper region 14 are equally separated from each other, and each divided part of the hole stopper region 14 has the same length. Alternatively, the divided parts of the hole stopper region 14 can be unequally separated from each other, and each divided part of the hole stopper region 14 can have a different length. For example, as shown in FIGS. 6A and 6B, the hole stopper region 14 can be divided into long and short parts, and the long and short parts of the hole stopper region 14 can be alternately arranged at a regular interval.

Second Embodiment

A second embodiment of the present disclosure is described. A difference between the first embodiment and the second embodiment is layouts of the emitter region 7 and the hole stopper region 14.

Figure 7:
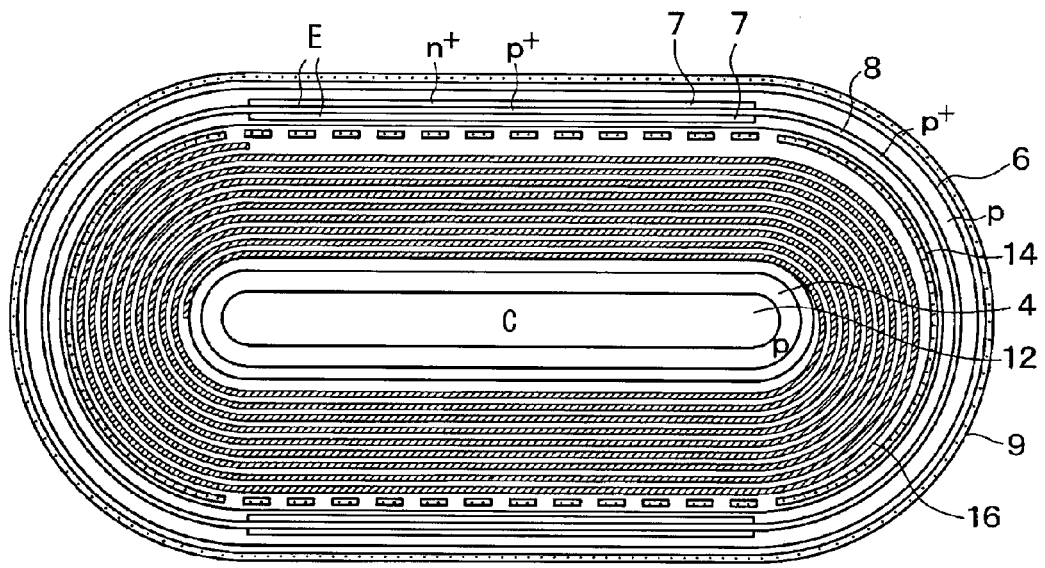
FIG. 7 is a diagram illustrating a top layout view of a semiconductor device according to a second embodiment of the present disclosure.

FIG. 7 is a diagram illustrating a top layout view of a semiconductor device according to the second embodiment. As shown in FIG. 7, according to the second embodiment, the emitter region 7 is shaped like a straight line extending in the longitudinal direction of the collector region 4. That is, the emitter region 7 has only the straight-shaped portion without the arc-shaped portion. The emitter region 7 is located on each side of the collector.

Like the first embodiment, the hole stopper region 14 has an ellipse shape, when viewed from the top, to surround the collector. That is, the hole stopper region 14 has both the straight-shaped portion and the arc-shaped portion. The straight-shaped portion of the hole stopper region 14 is divided into multiple sections. Unlike the first embodiment, the arc-shaped portion of the hole stopper region 14 is not divided. In other words, the arc-shaped portion of the hole stopper region 14 is continuous.

As described above, according to the second embodiment, the emitter region 7 does not have the arc-shaped portion so that the end of the collector cannot be surrounded by the emitter region 7. Further, the arc-shaped portion of the hole stopper region 14 is not divided so that the end of the collector can be entirely surrounded by the hole stopper region 14. Thus, it is possible to prevent the hole path from radiating from the ends of the collector.

In such an approach, electric field concentration on the ends of the collector is reduced so that the breakdown voltage of the lateral IGBT can be increased and stabilized.

(Modification of the Second Embodiment)

Figure 8:
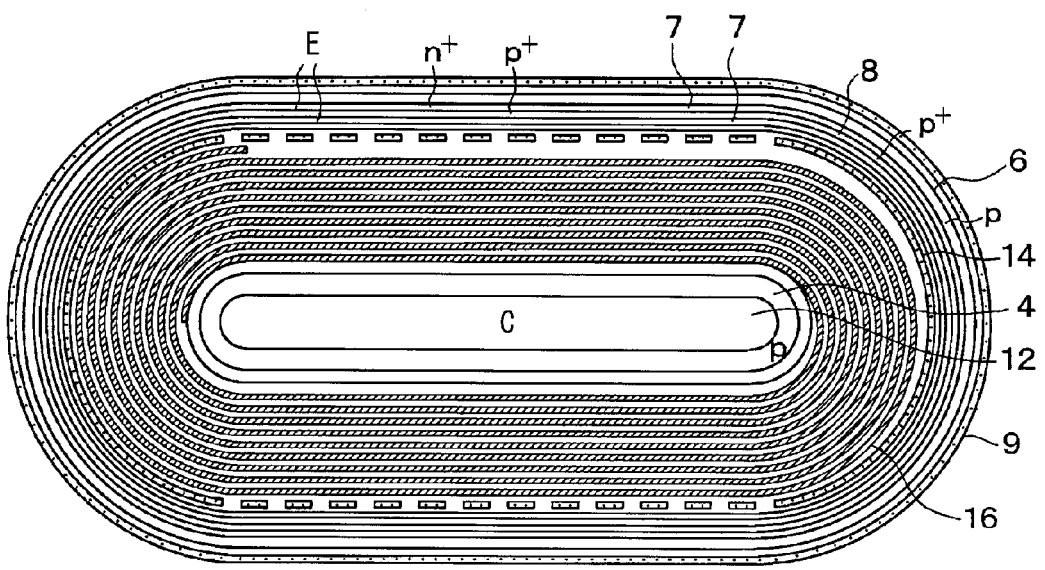
FIG. 8 is a diagram illustrating a top layout view of a semiconductor device according to a modification of the second embodiment.

In the second embodiment, the emitter region 7 does not have the arc-shaped portion. Alternatively, as shown in FIG. 8, the emitter region 7 can have both the straight-shaped portion and the arc-shaped portion while the arc-shaped portion of the hole stopper region 14 is continuous (i.e., not divided). Even in such a layout as shown in FIG. 8, the same effect as discussed above for the second embodiment can be achieved.

Third Embodiment

A third embodiment of the present disclosure is described below with reference to FIGS. 9 and 10. A difference between the first embodiment and the third embodiment is a structure of the hole stopper region 14.

Figure 9:
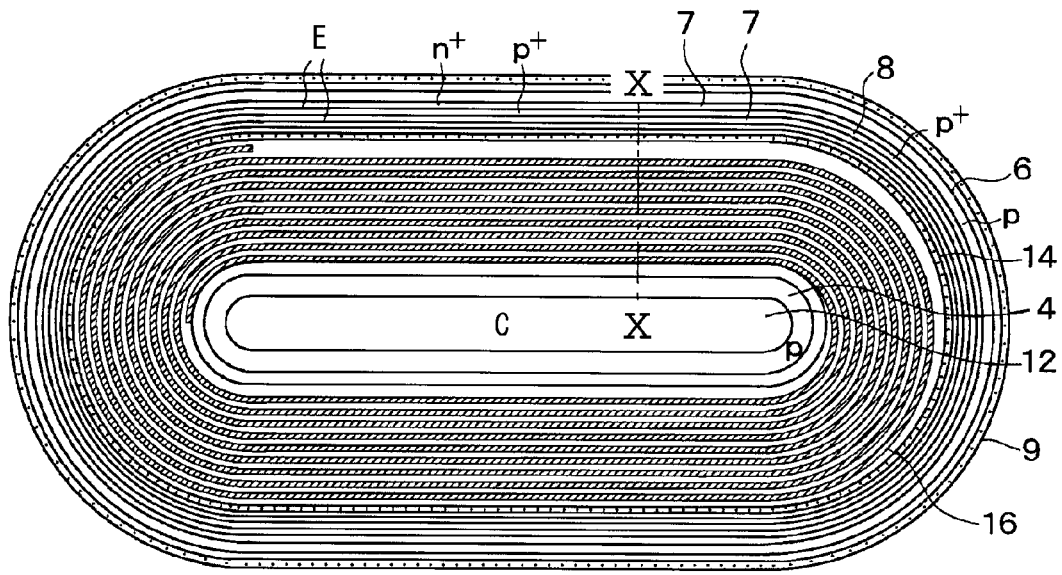
FIG. 9 is a diagram illustrating a top layout view of a semiconductor device according to a third embodiment of the present disclosure.
Figure 10:
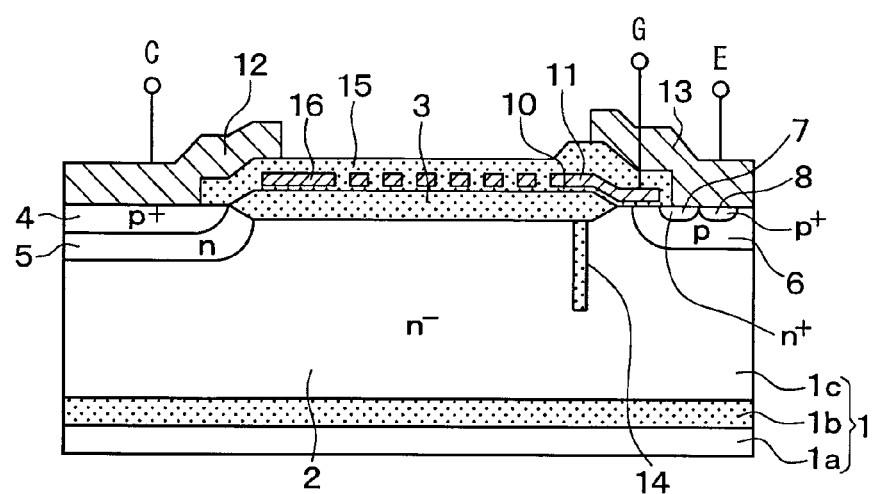
FIG. 10 is a diagram illustrating a cross-sectional view taken along line X-X in FIG. 9.

FIG. 9 is a diagram illustrating a top layout view of a semiconductor device according to the third embodiment, and FIG. 10 is a diagram illustrating a cross-sectional view taken along the line X-X in FIG. 9.

As shown in FIG. 10, according to the third embodiment, the hole stopper region 14 extends from the surface of the active layer is (i.e., the drift layer 2) to a predetermined depth of the drift layer 2. That is, the hole stopper region 14 does not penetrate the drift layer 2. In other words, the hope stopper region 14 does not reach the BOX layer 1b. As shown in FIG. 9, the hole stopper region 14 has a continuous ellipse shape, when viewed from the top, to surround the collector. That is, each of the straight-shaped portion and the arc-shaped portion of the hole stopper region 14 is continuous (i.e., not divided into multiple parts).

In such an structure as shown in FIGS. 9 and 10, the flow of the holes is concentrated at a position below the hole stopper region 14 so that the hole density can be increased at the position below the hole stopper region 14. Accordingly, the amount of injected electrons is increased. Thus, the same effect as discussed for the first embodiment can be achieved.

(Modification of the Third Embodiment)

In the third embodiment, the hole stopper region 14 extends from the surface of the drift layer 2 to a predetermined depth of the drift layer 2. That is, the hole stopper region 14 is located on only the surface side of the drift layer 2. Alternatively, the hole stopper region 14 can extend from a predetermined depth of the drift layer 2 toward the bottom of the drift layer 2 so that the flow of the holes can be concentrated near the channel region, which appears in the surface portion of the well layer 6. In this case, the hole stopper region 14 is formed in the active layer is before the active layer 1c is bonded to the supporting substrate 1a through the BOX layer 1b.

In the third embodiment, each of the emitter region 7 and the hole stopper region 14 has an ellipse shape to entirely surround the collector. Alternatively, the emitter region 7 and the hole stopper region 14 can have the shape as discussed in the first and second embodiments (including their modifications).

Fourth Embodiment

A fourth embodiment of the present disclosure is described below with reference to FIGS. 11A and 11B. A difference between the first embodiment and the fourth embodiment is a structure of the emitter region 7.

Figure 11A:
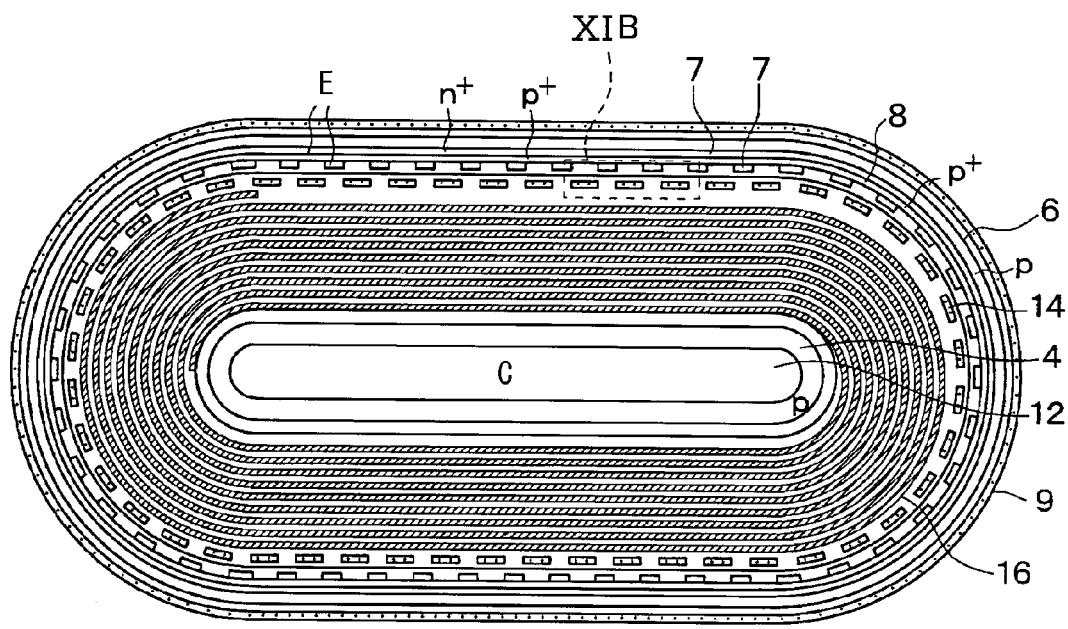
FIG. 11A is a diagram illustrating a top layout view of a semiconductor device according to a fourth embodiment of the present disclosure.
Figure 11B:
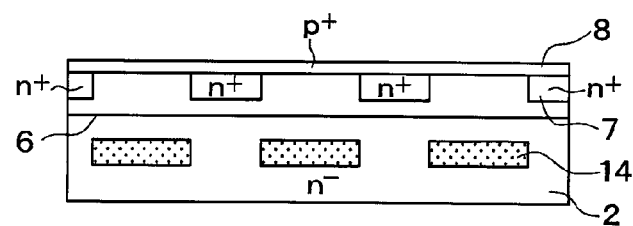
FIG. 11B is a diagram illustrating an enlarged view of an area XIB in FIG. 11A.

FIG. 11A is a diagram illustrating a top layout view of a semiconductor device according to the fourth embodiment, and FIG. 11B is a diagram illustrating an enlarged view of an area XIB in FIG. 11A. As shown in FIGS. 11A and 11B, according to the fourth embodiment, the emitter region 7 is divided according to the layout of the hole stopper region 14. Specifically, each divided part of the emitter region 7 is located between adjacent divided parts of the hole stopper region 14 in a direction from the collector to the emitter. That is, the emitter region 7 does not overlap the hole stopper region 14 in the direction from the collector to the emitter.

In such a structure as shown in FIGS. 11A and 11B, the hole stopper region 14 narrows the hole path and concentrates the flows of the holes. Further, since the emitter region 7 is located at a position corresponding to the hole path narrowed by the hole stopper region 14, a current capability can be improved. The structure of the fourth embodiment can be combined with any of the structures as discussed in the preceding embodiments (including their modifications).

(Modification of the Fourth Embodiment)

Figure 12A:
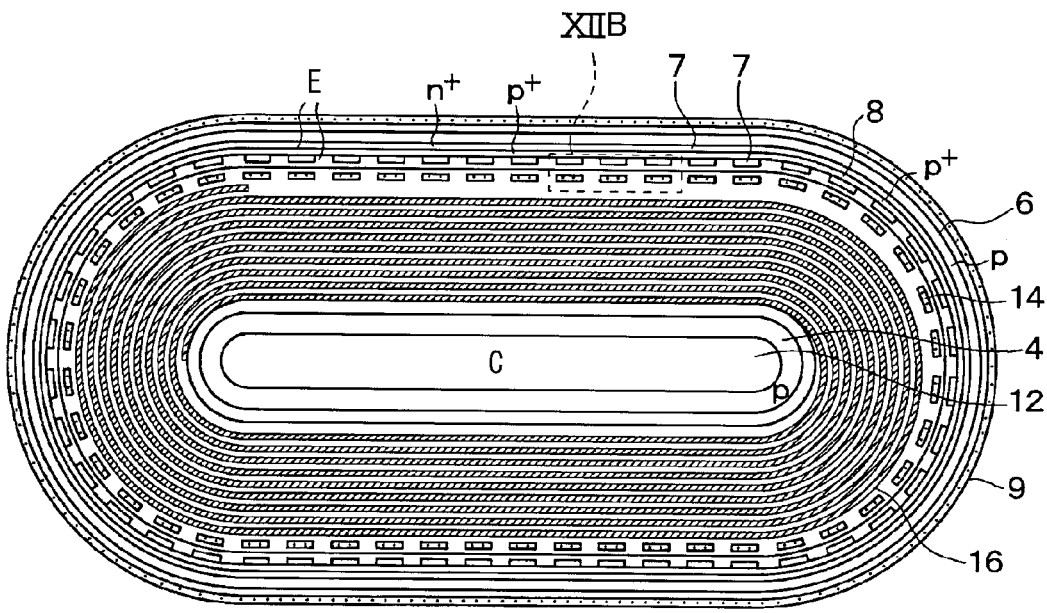
FIG. 12A is a diagram illustrating a top layout view of a semiconductor device according to a modification of the fourth embodiment.
Figure 12B:
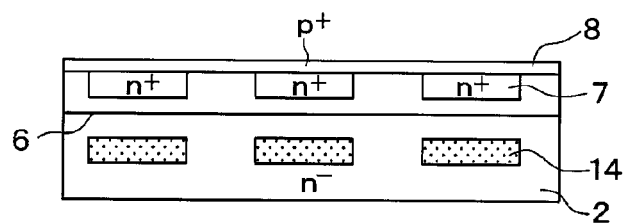
FIG. 12B is a diagram illustrating an enlarged view of an area XIIB in FIG. 12A.

In the fourth embodiment, the emitter region 7 is divided according to the layout of the hole stopper region 14 in such a manner that the emitter region 7 does not overlap the hole stopper region 14 in the direction from the collector to the emitter. Alternatively, for example, the emitter region 7 can be divided as shown in FIGS. 12A and 12B. FIG. 12A is a diagram illustrating a top layout view of a semiconductor device according to a modification of the fourth embodiment, and FIG. 12B is a diagram illustrating an enlarged view of an area XIIB in FIG. 12A. As shown in FIGS. 12A and 12B, the emitter region 7 can be divided in the same manner as the hole stopper region 14 so that the emitter region 7 can overlap the hole stopper region 14 in the direction from the collector to the emitter.

In such a structure as shown in FIGS. 12A and 12B, since the hole path narrowed by the hole stopper region 14 directly faces the contact layer 8, the holes are easily drawn to the contact layer 8 at the time of the switching operation so that the switching speed can be improved.

Fifth Embodiment

A fifth embodiment of the present disclosure is described below with reference to FIGS. 13A and 13B. A difference between the first embodiment and the fifth embodiment is a structure of the lateral IGBT.

Figure 13A:
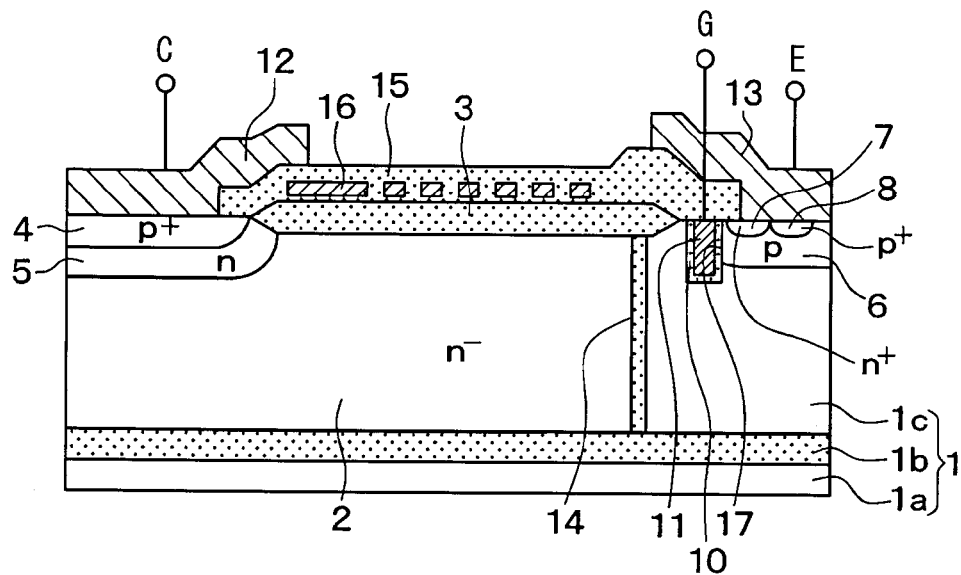
FIG. 13A is a diagram, corresponding to FIG. 2A, and illustrating a cross-sectional view of a semiconductor device according to a fifth embodiment of the present disclosure.
Figure 13B:
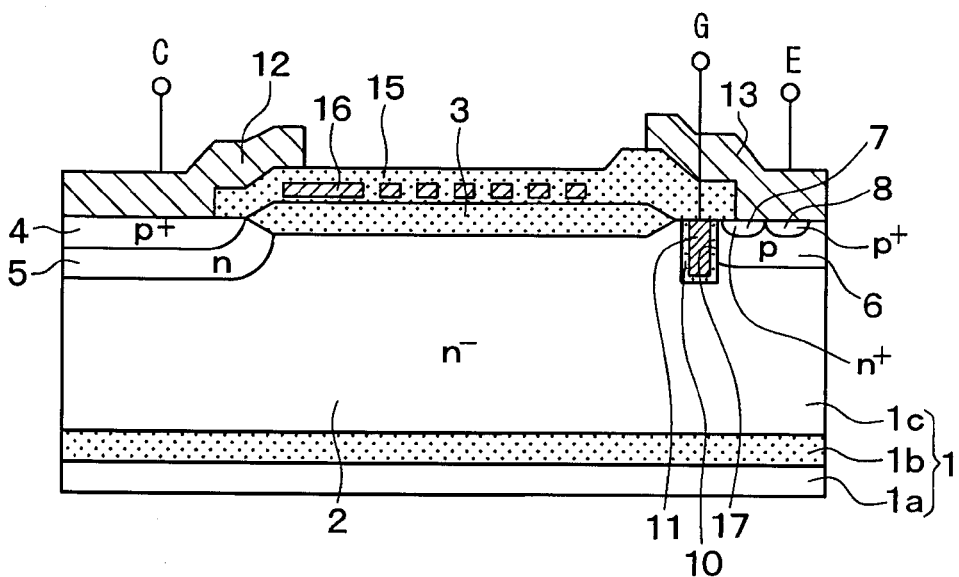
FIG. 13B is a diagram, corresponding to FIG. 2B, and illustrating a cross-sectional view of the semiconductor device according to the fifth embodiment.

FIG. 13A is a diagram, corresponding to FIG. 2A, and illustrating a cross-sectional view of a semiconductor device according to the fifth embodiment. FIG. 13B is a diagram, corresponding to FIG. 2B, and illustrating a cross-sectional view of the semiconductor device according to the fifth embodiment. A top layout view of the semiconductor device according to the fifth embodiment is the same as that of the semiconductor device according to the first embodiment and shown in FIG. 1.

According to the fifth embodiment, the lateral IGBT has a trench gate structure instead of a planar gate structure. Specifically, as shown in FIGS. 13A and 13B, a trench 17 is formed in the surface portion of the drift layer 2, and the gate electrode 11 is formed in the trench 17 through the gate insulating layer 10. A side wall of the trench 17 is in contact with the well layer 6 and the emitter region 7. The channel region appears in a side portion of the well layer 6 so that the lateral IGBT can act. The side portion of the well layer 6 is in contact which the side wall of the trench 17 and located between the emitter region 7 and the drift layer 2.

As described above, according to the fifth embodiment, the lateral IGBT has a trench gate structure, and the hole stopper region 14 is formed in the drift layer 2 as shown FIG. 13A. Thus, the same effect as discussed for the first embodiment can be achieved. The structure of the fifth embodiment can be combined with any of the structures as discussed in the preceding embodiments (including their modifications).

(Modification of the Fifth Embodiment)

Figure 14:
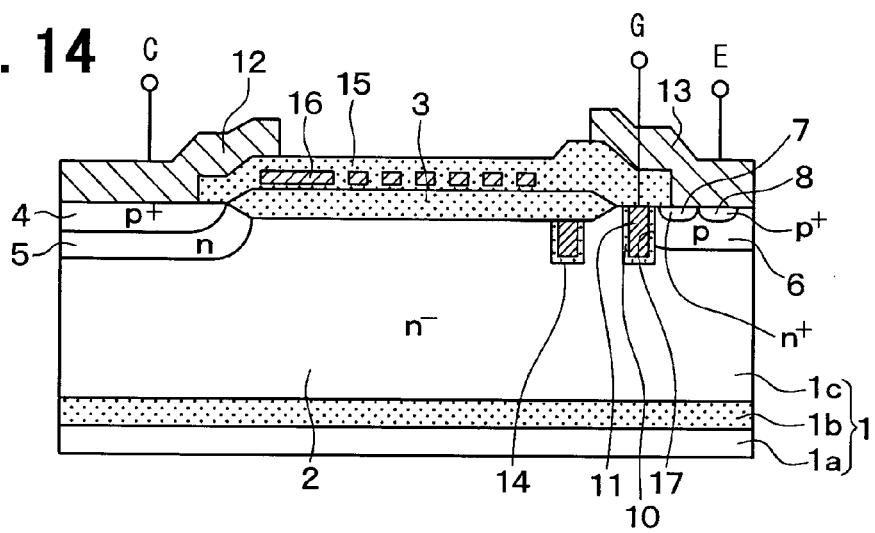
FIG. 14 is a diagram, corresponding to FIG. 2A, and illustrating a cross-sectional view of a semiconductor device according to a modification of the fifth embodiment.

In the fifth embodiment, the hole stopper region 14 extends from the surface of the drift layer 2 to the BOX layer 1b by penetrating the drift layer 2. Alternatively, like the third embodiment, the hole stopper region 14 can extend from the surface of the drift layer 2 to a predetermined depth of the drift layer 2 without reaching the BOX layer 1b. For example, as shown in FIG. 14, the hole stopper region 14 can have the same structure as the trench gate structure. That is, the hole stopper region 14 can be formed by filling a trench with electrically insulating film and polysilicon. In such an approach, the trench gate structure and the hole stopper region 14 can be simultaneously formed in the same manufacturing process. Thus, an addition process for forming the hole stopper region 14 is unnecessary.

Figure 15A:
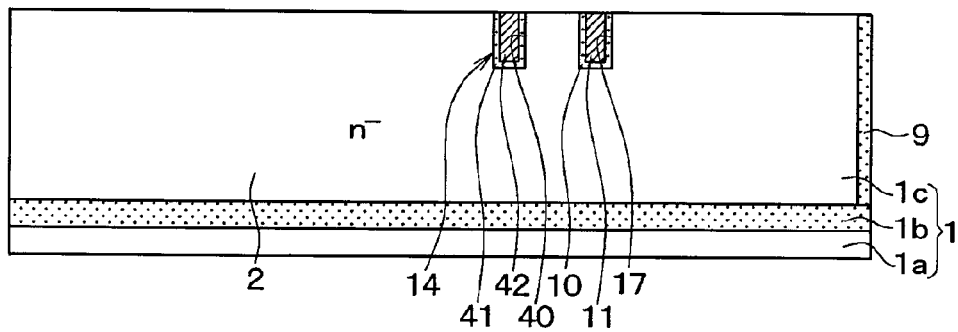
FIGS. 15A and 15B are diagrams illustrating manufacturing processes of the semiconductor device of FIG. 14.
Figure 15B:
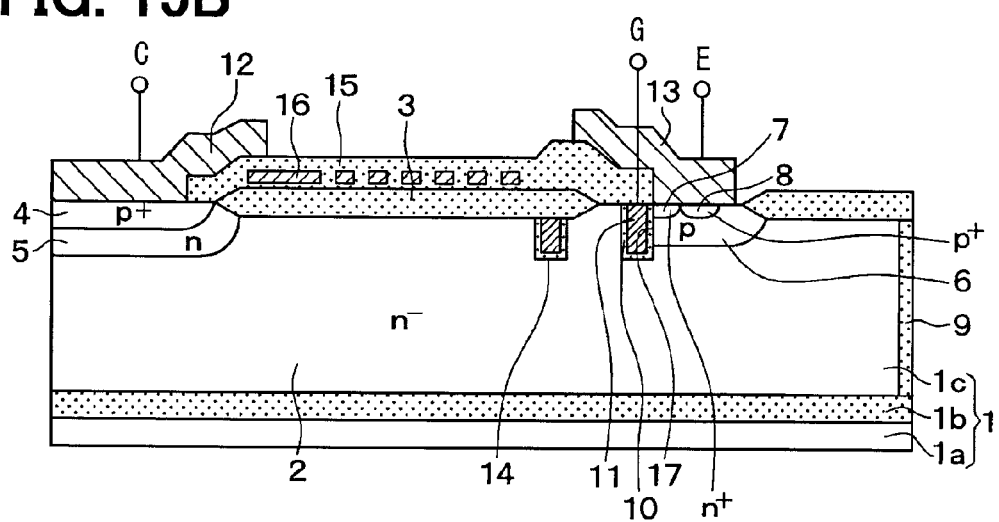

Specifically, as shown in FIG. 15A, the trench isolation structure 9 is formed in the active layer 1c (i.e., the drift layer 2) of the SOI substrate 1 by forming a trench, by oxidizing an inner wall of the trench, and by depositing polysilicon in the trench. Then, not only the trench 17 for the trench gate structure but also a trench 40 for the hole stopper region 14 are formed in the drift layer 2. Then, an oxidation process is performed so that the gate insulating layer 10 can be formed on the inner wall of the trench 17 and that an electrically insulating layer 41 can be formed on an inner wall of the trench 40. Then, a doped-polysilicon layer is formed over the surface of the drift layer so that the trenches 17 and 40 can be filled with the doped-polysilicon layer. Then, the doped-polysilicon layer is etched back so that the gate electrode 11 can be formed in the trench 17 and that a polysilicon layer 42 can be formed in the trench 40. In this way, the hole stopper region 14 having the same structure as the trench gate structure can be formed. After the hole stopper region 14 and the gate isolation structure are formed, processes, such as LOCOS oxidation and ion implantation, necessary for manufacturing the lateral IGBT are performed in the same manner as described in the preceding embodiments. Thus, as shown in FIG. 15B, the lateral IGBT including the hole stopper region 14 having the same structure as the trench gate structure can be manufactured.

Sixth Embodiment

A sixth embodiment of the present disclosure is described below with reference to FIG. 16, FIGS. 17A and 17B, and FIGS. 18A and 18B. A difference between the first embodiment and the sixth embodiment is a method of forming the hole stopper region 14. Specifically, according to the sixth embodiment, the hole stopper region 14 and the trench isolation structure 9 are simultaneously formed.

Figure 16:
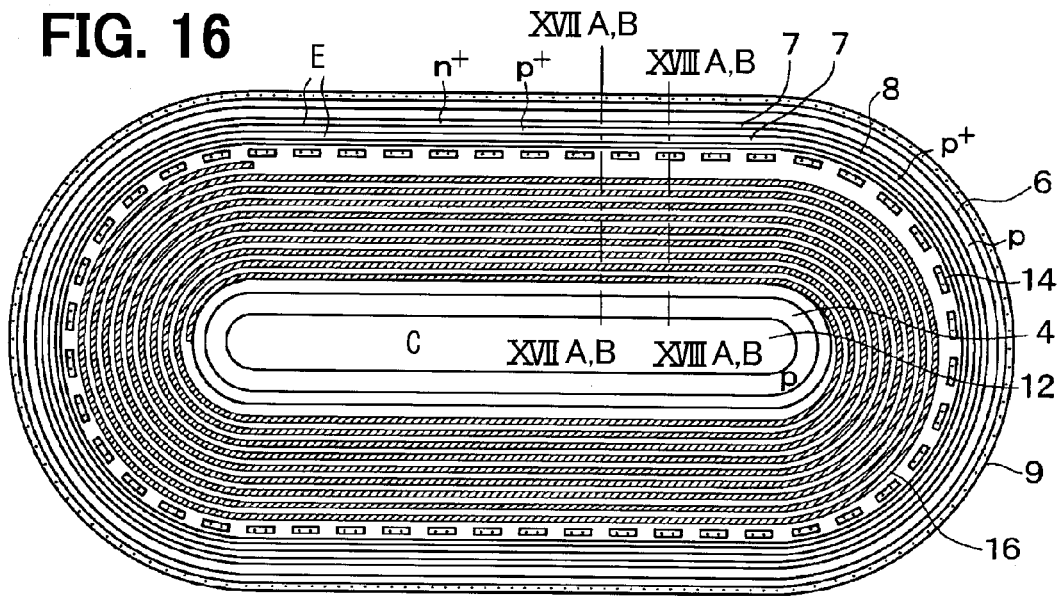
FIG. 16 is a diagram illustrating a top layout view of a semiconductor device according to a sixth embodiment of the present disclosure.
Figure 17A:
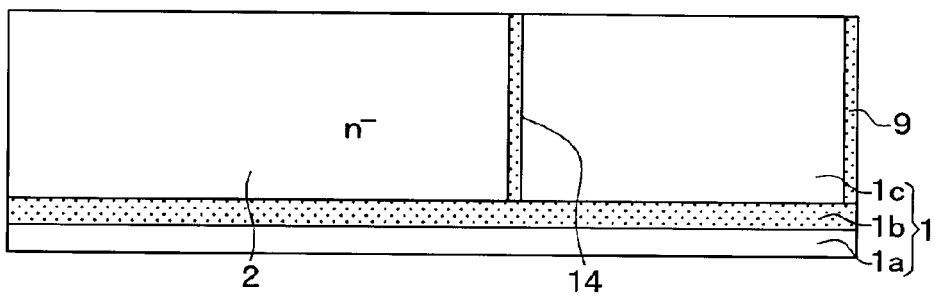
FIGS. 17A and 17B are diagrams illustrating manufacturing processes of the semiconductor device of FIG. 16 taken along line XVIIA,B-XVIIA,B in FIG. 16.
Figure 17B:
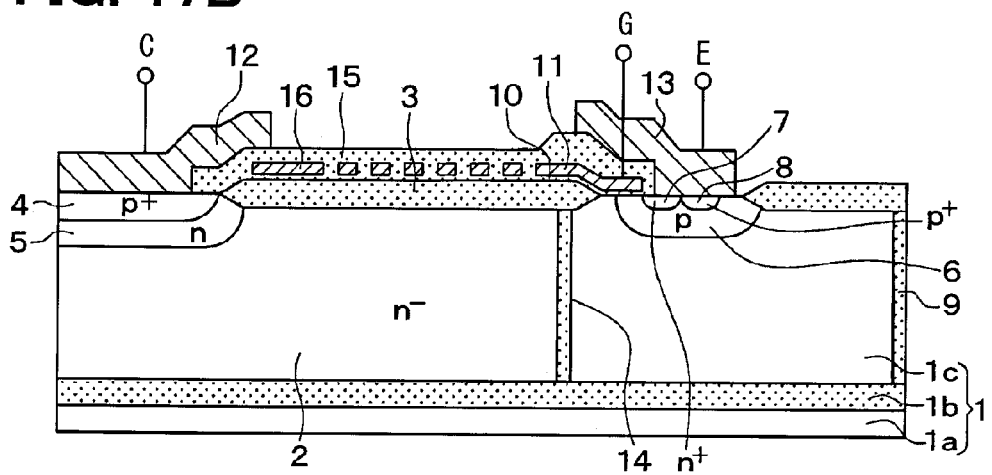
Figure 18A:
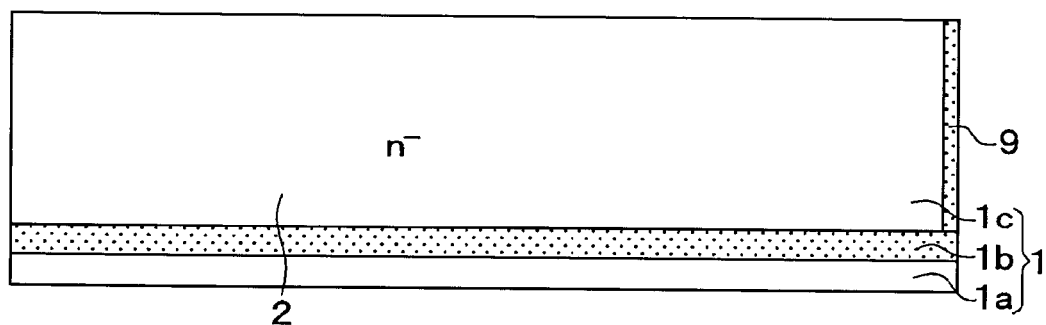
FIGS. 18A and 18B are diagrams illustrating manufacturing processes of the semiconductor device of FIG. 16 taken along line XVIIIA,B-XVIIIA,B in FIG. 16.
Figure 18B:
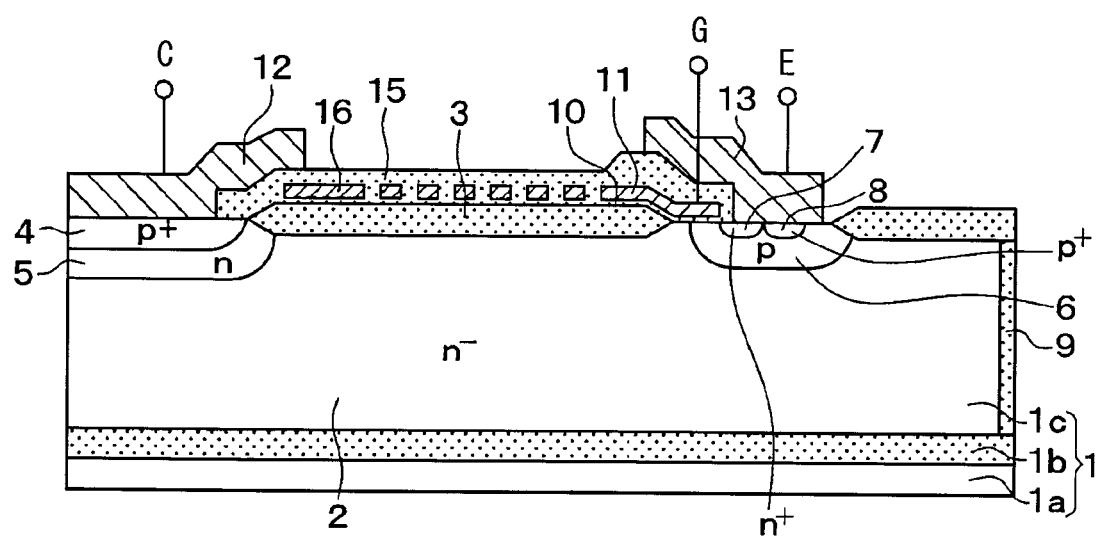

FIG. 16 is a diagram illustrating a top layout view of a semiconductor device according to the sixth embodiment. FIGS. 17A and 17B are diagrams illustrating manufacturing processes of the semiconductor device of FIG. 16 taken along the line XVIIA,B-XVIIA,B in FIG. 16. FIGS. 18A and 18B are diagrams illustrating manufacturing processes of the semiconductor device of FIG. 16 taken along the line XVIIIA,B-XVIIIA,B in FIG. 16.

As shown in FIG. 16, each lateral IGBT is surrounded by the trench isolation structure 9. Thus, the lateral IGBTs are isolated from each other by the trench isolation structure 9. The semiconductor device shown in FIG. 16 is manufactured as follows. Firstly, as shown in FIGS. 17A and 18A, after the SOI substrate 1 is prepared, the trench isolation structure 9 and the hole stopper region 14 simultaneously formed in the active layer is (i.e., the drift layer 2) of the SOI substrate 1 by forming a trench, by oxidizing an inner wall of the trench, and by depositing polysilicon in the trench. Then, processes, such as LOCOS oxidation and ion implantation, necessary for manufacturing the lateral IGBT are performed in the same manner as described in the preceding embodiments. Thus, as shown in FIGS. 17B and 18B, the lateral IGBT including the hole stopper region 14 having the same structure as the trench isolation structure 9 can be manufactured.

As described above, according to the sixth embodiment, the trench isolation structure 9 and the hole stopper region 14 simultaneously formed in the same manufacturing processes. In such an approach, an addition process for forming the hole stopper region 14 is unnecessary.

Seventh Embodiment

A seventh embodiment of the present disclosure is described below with reference to FIGS. 19A and 19B. A difference between the first embodiment and the seventh embodiment is that the SOI substrate 1 is not used.

Figure 19A:
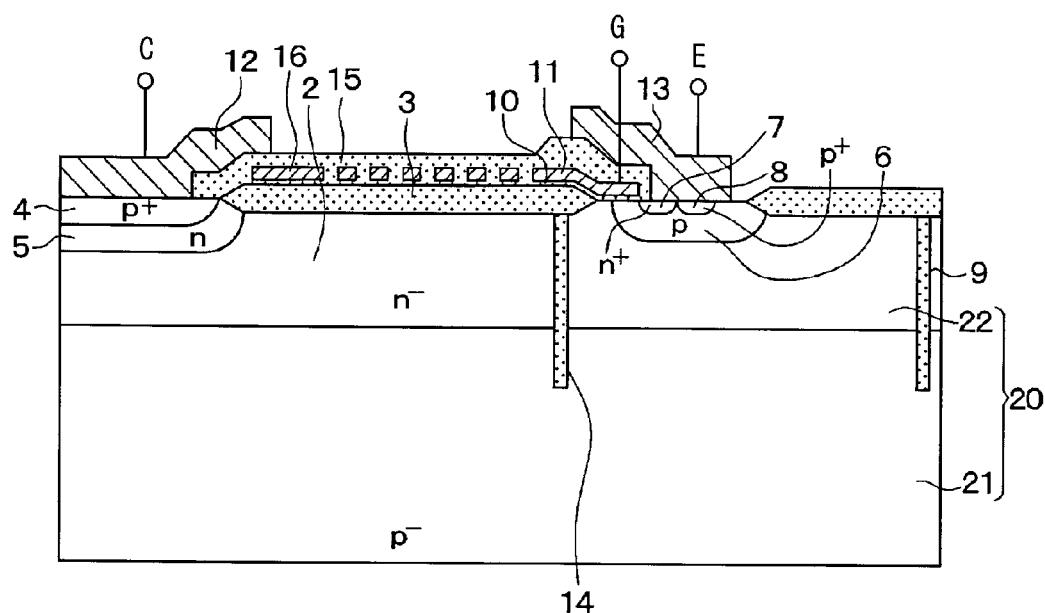
FIG. 19A is a diagram, corresponding to FIG. 2A, and illustrating a cross-sectional view of a semiconductor device according to a seventh embodiment of the present disclosure.

FIG. 19A is a diagram, corresponding to FIG. 2A, and illustrating a cross-sectional view of a semiconductor device according to the seventh embodiment. FIG. 19B is a diagram, corresponding to FIG. 2B, and illustrating a cross-sectional view of the semiconductor device according to the seventh embodiment. A top layout view of the semiconductor device according to the seventh embodiment is the same as that of the semiconductor device according to the first embodiment and shown in FIG. 1.

Figure 19B:
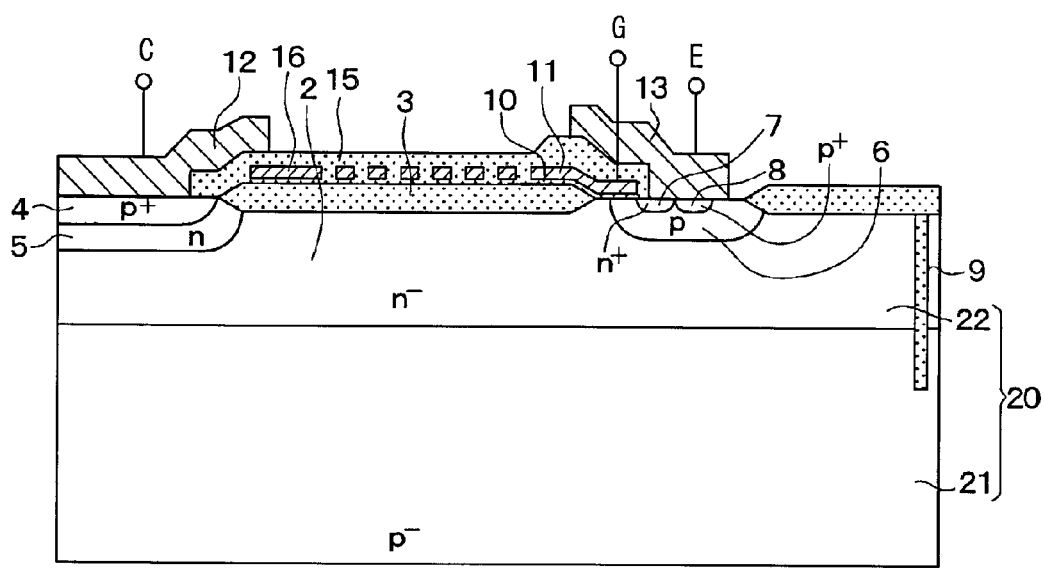
FIG. 19B is a diagram, corresponding to FIG. 2B, and illustrating a cross-sectional view of the semiconductor device according to the seventh embodiment.

As shown in FIGS. 19A and 19B, according to the seventh embodiment, the lateral IGBT is formed by using a semiconductor substrate 20 instead of the SOI substrate 1. The semiconductor substrate 20 includes a $p^-$-type silicon substrate 21 and a $n^-$-type layer 22 formed on the silicon substrate 21. The $n^-$-type layer 22 serves as the drift layer 2. The lateral IGBT is surrounded by a deep trench isolation structure 9. The deep trench isolation structure 9 extends from the surface of the $n^-$-type layer 22 to the silicon substrate 21 by penetrating the $n^-$-type layer 22. For example, the deep trench isolation structure 9 has a trench filled with polysilicon and an electrically insulating film. Thus, the lateral IGBT are electrically isolated from each other by the deep trench isolation structure 9.

As shown in FIG. 19A, the lateral IGBT has the hole stopper region 14. For example, the hole stopper region 14 can have the same structure as the deep trench isolation structure 9. That is, the hole stopper region 14 can be formed by filling a trench with electrically insulating film and polysilicon. In such an approach, the deep trench isolation structure 9 and the hole stopper region 14 can be simultaneously formed in the same manufacturing process. Thus, an addition process for forming the hole stopper region 14 is unnecessary.

The structure of the seventh embodiment can be combined with any of the structures as discussed in the preceding embodiments (including their modifications).

Eighth Embodiment

An eighth embodiment of the present disclosure is described below with reference to FIGS. 20A and 20B. A difference between the first embodiment and the eighth embodiment is that the SOI substrate 1 is not used.

Figure 20A:
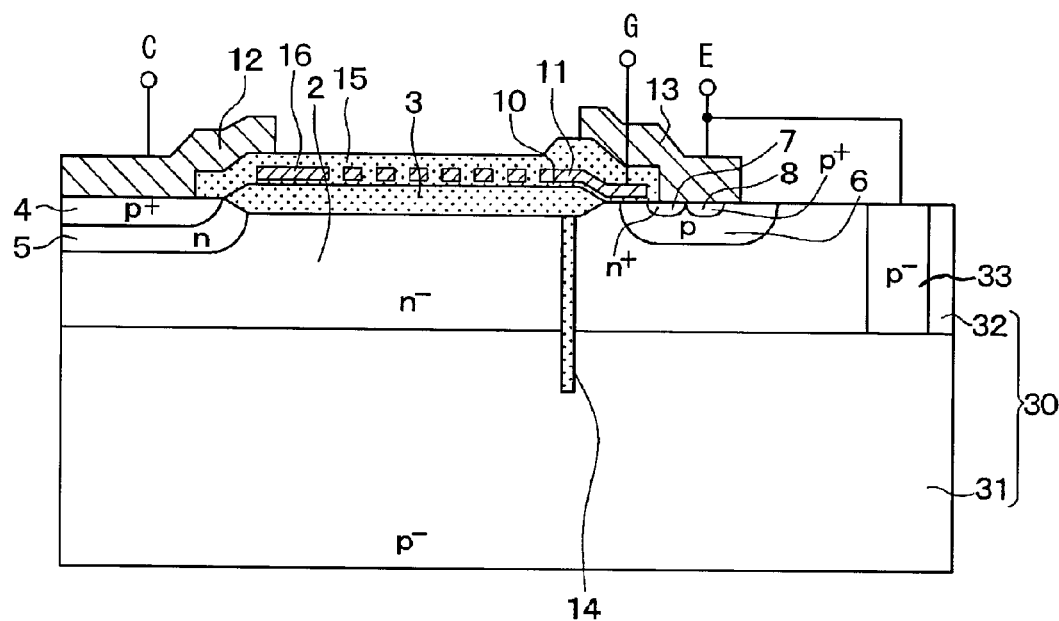
FIG. 20A is a diagram, corresponding to FIG. 2A, and illustrating a cross-sectional view of a semiconductor device according to an eighth embodiment of the present disclosure.

FIG. 20A is a diagram, corresponding to FIG. 2A, and illustrating a cross-sectional view of a semiconductor device according to the eighth embodiment. FIG. 20B is a diagram, corresponding to FIG. 2B, and illustrating a cross-sectional view of the semiconductor device according to the eight embodiment. A top layout view of the semiconductor device according to the eighth embodiment is the same as that of the semiconductor device according to the first embodiment and shown in FIG. 1.

Figure 20B:
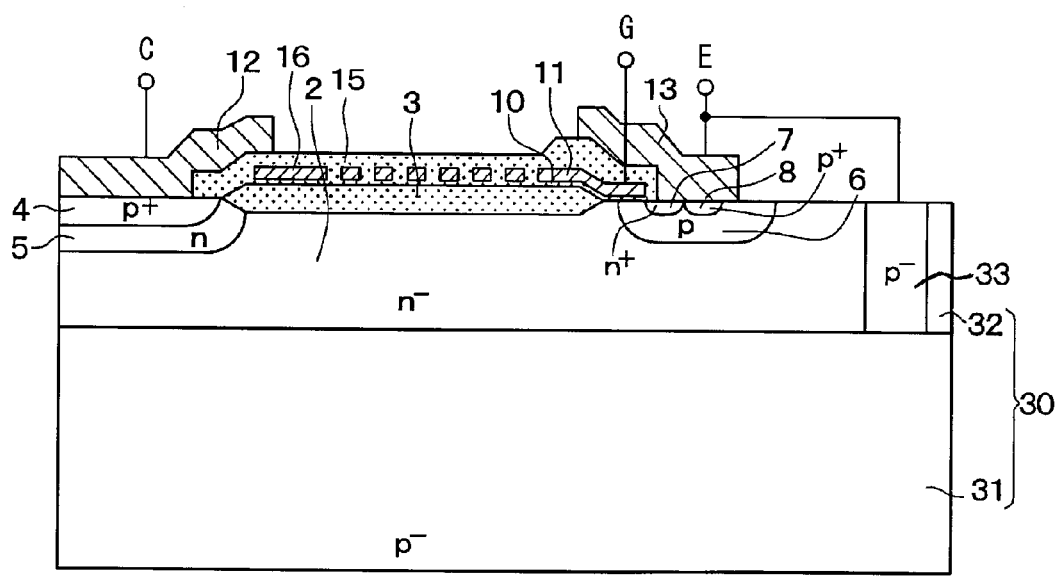
FIG. 20B is a diagram, corresponding to FIG. 2B, and illustrating a cross-sectional view of the semiconductor device according to the eighth embodiment.

As shown in FIGS. 20A and 20B, according to the eighth embodiment, the lateral IGBT is formed by using a semiconductor substrate 30 instead of the SOI substrate 1. The semiconductor substrate 30 includes a $p^-$-type silicon substrate 31 and a $n^-$-type layer 32 formed on the silicon substrate 31. The $n^-$-type layer 32 serves as the drift layer 2. The lateral IGBT is surrounded by a $p^-$-type isolation region 33. The $p^-$-type isolation region 33 extends from the surface of the $n^-$-type layer 32 to the silicon substrate 31 by penetrating the $n^-$-type layer 32. Thus, the $p^-$-type isolation region 33 and the $n^-$-type layer 32 form a PN junction isolation structure. Specifically, the $p^-$-type isolation region 33 is electrically connected to the emitter electrode 13 so that the $p^-$-type silicon substrate 31 and the $p^-$-type isolation region 33 can be clamped to the emitter potential. Thus, the lateral IGBT are electrically isolated from each other by the PN junction isolation structure.

The structure of the eighth embodiment can be combined with any of the structures as discussed in the preceding embodiments (including their modifications).

Ninth Embodiment

A ninth embodiment of the present disclosure is described below with reference to FIGS. 21A and 21B. A difference between the first embodiment and the ninth embodiment is a contact structure between the collector electrode 12 and the collector region 4.

Figure 21A:
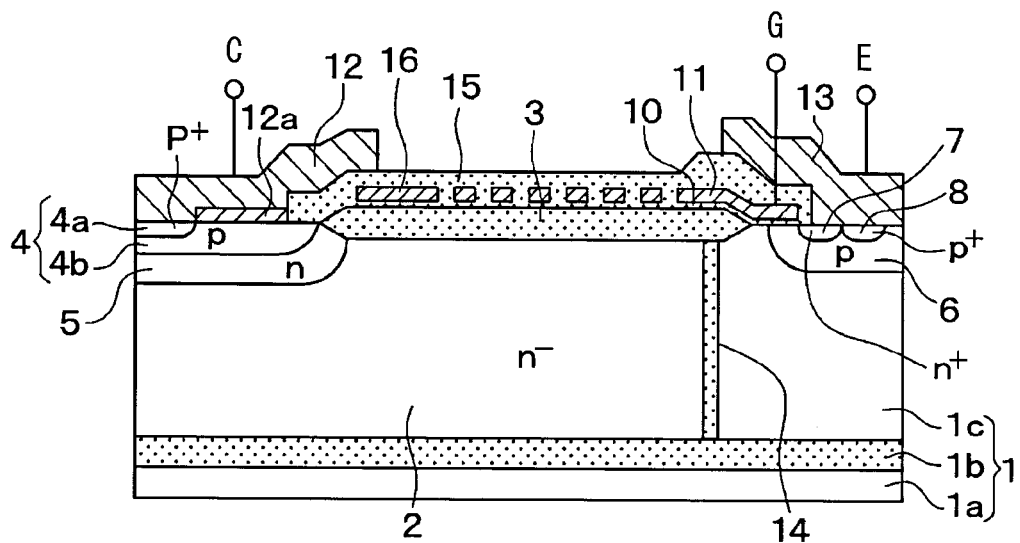
FIG. 21A is a diagram, corresponding to FIG. 2A, and illustrating a cross-sectional view of a semiconductor device according to a ninth embodiment of the present disclosure.

FIG. 21A is a diagram, corresponding to FIG. 2A, and illustrating a cross-sectional view of a semiconductor device according to the ninth embodiment. FIG. 21B is a diagram, corresponding to FIG. 2B, and illustrating a cross-sectional view of the semiconductor device according to the ninth embodiment. A top layout view of the semiconductor device according to the ninth embodiment is the same as that of the semiconductor device according to the first embodiment and shown in FIG. 1.

Figure 21B:
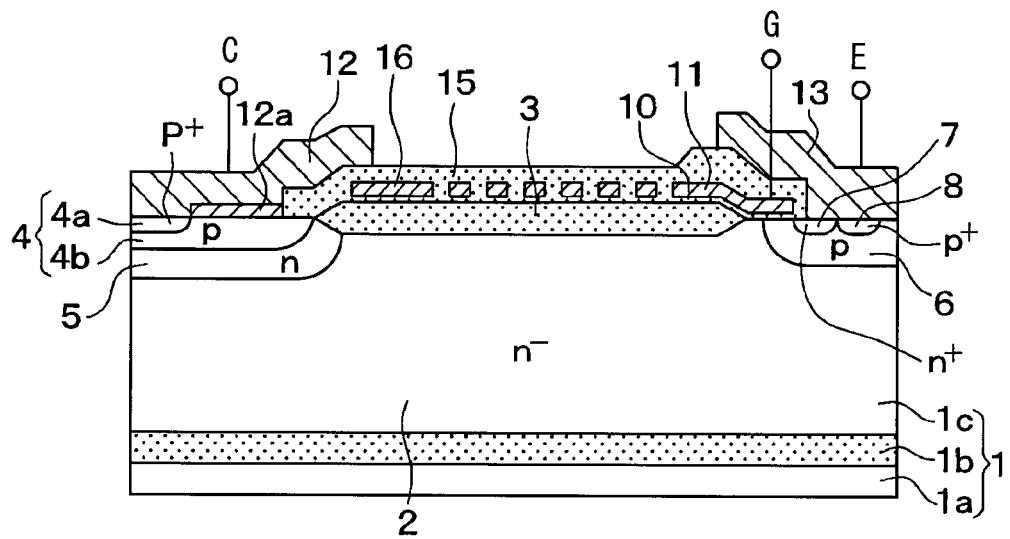
FIG. 21B is a diagram, corresponding to FIG. 2B, and illustrating a cross-sectional view of the semiconductor device according to the ninth embodiment.

As shown in FIGS. 21A and 21B, the collector region 4 includes a p$^+$-type layer 4a and a p-type layer 4b. An impurity concentration of the p$^+$-type layer 4a is greater than an impurity concentration of the p-type layer 4b. According to the ninth embodiment, the p$^+$-type layer 4a is surrounded by the p-type layer 4b. The collector electrode 12 is electrically connected to each of the p$^+$-type layer 4a and the p-type layer 4b. Specifically, the collector electrode 12 forms an Ohmic contact with the p$^+$-type layer 4a and forms a Schottky contact with the p-type layer 4b through a barrier metal 12a. Since the p$^+$-type layer 4a is surrounded by the p-type layer 4b, the p-type layer 4b is located closer to the emitter than the p$^+$-type layer 4a.

As discussed in the first embodiment, the hole stopper region 14 can increase the hole density near the emitter region 7. However, since the holes flow into the emitter at the time of turn-OFF of the lateral IGBT, it may be likely that a parasitic bipolar transistor, affecting the breakdown voltage, is turned ON.

According to the ninth embodiment, the collector electrode 12 forms a Schottky contact with the p-type layer 4b. The Schottky contact reduces the holes injected from the collector so that the amount of accumulated carriers can be reduced. Thus, it is less likely that the parasitic bipolar transistor is turned ON. Therefore, the breakdown voltage can be maintained while achieving the low ON-voltage and the fast switching.

The structure of the ninth embodiment can be combined with any of the structures as discussed in the preceding embodiments (including their modifications).

(Modifications)

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

For example, the present disclosure can be applied to a p-channel lateral IGBT by interchanging the conductivity types in the embodiments.

What is claimed is:

1. A semiconductor device having a lateral insulated gate bipolar transistor, the semiconductor device comprising:
    a semiconductor substrate having a first conductivity type drift layer;
    a second conductivity type collector region formed in a surface portion of the drift layer and having a longitudinal direction;
    a second conductivity type channel layer formed in the surface portion of the drift layer and having a straight-shaped portion located on each side of the collector region;
    a first conductivity type emitter region formed in a surface portion of the channel layer and terminated inside the channel layer, the emitter region having a straight-shaped portion extending parallel to the longitudinal direction;
    a gate insulation layer in contact with a channel region of the channel layer, the channel region located between the emitter region and the drift layer;
    a gate electrode formed on a surface of the gate insulation layer;
    a collector electrode electrically connected to the collector region;
    an emitter electrode electrically connected to the emitter region and the channel layer; and
    a hole stopper region formed in the drift layer and located between the collector region and the emitter region, wherein
    holes are injected from the collector region into the drift layer and flow toward the emitter region through a hole path, and
    the hole stopper region blocks a flow of the holes and narrows the hole path to concentrate the holes.

2. The semiconductor device according to claim 1, wherein
    the hole stopper region surrounds the collector region,
    the hole stopper region has a straight-shaped portion and a arc-shaped portion,
    the straight-shaped portion of the hole stopper region extends parallel to the longitudinal direction,
    the arc-shaped portions of the hole stopper region surrounds an end of the collector region in the longitudinal direction,
    the straight-shaped portion of the hole stopper region is divided, and
    the hole path is narrowed between adjacent divided straight-shaped portions of the hole stopper region.

3. The semiconductor device according to claim 2, wherein
    the emitter region has an arc-shaped portion,
    the arc-shaped portion of the emitter region surrounds the end of the collector region, and
    the arc-shaped portion of the hole stopper region is divided.

4. The semiconductor device according to claim 2, wherein
    the emitter region has an arc-shaped portion,
    the arc-shaped portion of the emitter region surrounds the end of the collector region, and
    the arc-shaped portion of the hole stopper region is continuous.

5. The semiconductor device according to claim 3, wherein
    each of the divided straight-shaped portions of the hole stopper region has a same length,
    the divided straight-shaped portions of the hole stopper region are equally separated from each other,
    each of the divided arc-shaped portions of the hole stopper region has a same length, and
    the divided arc-shaped portions of the hole stopper region are equally separated from each other.

6. The semiconductor device according to claim 3, wherein
    at least one of the divided straight-shaped portions has a different length, and
    at least one of the divided arc-shaped portions has a different length.

7. The semiconductor device according to claim 1, wherein
    the semiconductor substrate is a SOI substrate including a supporting substrate, a buried insulating layer on the supporting substrate, and an active layer on the buried insulating layer,
    the active layer serves as the drift layer, and the hole stopper region extends from a surface of the drift layer to the buried insulating layer.

8. The semiconductor device according to claim 1, wherein
the semiconductor substrate includes a second conductivity-type substrate and a first conductivity-type layer on the second conductivity-type substrate,
the first conductivity-type layer serves as the drift layer, and
the hole stopper region extends from a surface of the first conductivity-type layer to the second conductivity-type substrate.

9. The semiconductor device according to claim 1, further comprising:
a trench isolation structure surrounding the lateral insulated gate bipolar transistor, wherein
the hole stopper region and the trench isolation structure have the same structure.

10. The semiconductor device according to claim 8, further comprising:
a second conductivity type isolation region located in the drift layer and extending to the second conductivity-type substrate,
the isolation region and the second conductivity-type substrate are electrically connected to the emitter electrode and clamped to a potential of the emitter electrode, and
the lateral insulated gate bipolar is surrounded by the isolation region.

11. The semiconductor device according to claim 1, wherein
the semiconductor substrate is a SOI substrate including a supporting, substrate, a buried insulating layer on the supporting substrate, and an active layer on the buried insulating layer,
the active layer serves as the drift layer, and
the hole stopper region extends from a surface of the active layer to a predetermined depth of the active layer without reaching the buried insulating layer.

12. The semiconductor device according to claim 1, wherein
the semiconductor substrate is a SOI substrate including a supporting substrate, a buried insulating layer on the supporting substrate, and an active layer on the buried insulating layer,
the hole stopper region surrounds the collector region,
the hole stopper region has a straight-shaped portion and a arc-shaped portion,
the straight-shaped portion of the hole stopper region extends parallel to the longitudinal direction,
the arc-shaped portions of the hole stopper region surrounds an end of the collector region in the longitudinal direction,
the active layer serves as the drift layer, and
the hole stopper region extends from a surface of the active layer to a predetermined depth of the active layer without reaching the buried insulating layer.

13. The semiconductor device according to claim 1, wherein
the lateral insulated gate bipolar has a planar gate structure, and
the gate insulation layer and the gate electrode semiconductor substrate are located on a surface of the channel layer on a surface of the semiconductor substrate.

14. The semiconductor device according to claim 1, wherein
the lateral insulated gate bipolar has a trench gate structure including a trench,
the gate insulation layer and the gate electrode are located in the trench, and
the channel region of the channel layer is in contact with a side wall of the trench.

15. The semiconductor device according to claim 1, wherein
the hole stopper region is in contact with the channel layer.

16. The semiconductor device according to claim 1, wherein
the hole stopper region is in contact with the emitter region.

* * * * *